US012701723B2

(12) United States Patent (10) Patent No.: US 12,701,723 B2
Katakam et al. (45) Date of Patent: Aug. 4, 2026

(54) METAL SPACER 3D-MIM CAPACITOR

(71) Applicant: International Business Machines Corporation, Armonk, NY (US)

(72) Inventors: Shravana Kumar Katakam, Lehi, UT (US); Ashim Dutta, Clifton Park, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 375 days.

(21) Appl. No.: 18/479,452

(22) Filed: Oct. 2, 2023

(65) Prior Publication Data

US 2025/0113498 A1 Apr. 3, 2025

(51) Int. Cl.
| | |
|---|---|
| *H10D 1/00* | (2025.01) |
| *H01G 4/012* | (2006.01) |
| *H01G 4/08* | (2006.01) |
| *H01G 4/33* | (2006.01) |
| *H10D 1/68* | (2025.01) |

(52) U.S. Cl.
CPC ............. *H10D 1/043* (2025.01); *H01G 4/012* (2013.01); *H01G 4/085* (2013.01); *H01G 4/33* (2013.01); *H10D 1/042* (2025.01); *H10D 1/714* (2025.01)

(58) Field of Classification Search
None
See application file for complete search history.

(56) References Cited

U.S. PATENT DOCUMENTS

| | | | | |
|---|---|---|---|---|
| 5,675,184 | A | 10/1997 | Matsubayashi et al. | |
| 5,879,985 | A | 3/1999 | Gambino et al. | |
| 6,417,535 | B1 * | 7/2002 | Johnson ................. | H10D 1/716 |
| | | | | 257/E21.018 |
| 6,461,914 | B1 | 10/2002 | Roberts et al. | |
| 6,670,237 | B1 | 12/2003 | Loh et al. | |
| 6,764,915 | B2 | 7/2004 | Lee | |
| 7,439,570 | B2 * | 10/2008 | Anthony ............. | H01L 23/5223 |
| | | | | 438/239 |
| 8,445,355 | B2 * | 5/2013 | Abou-Khalil .......... | H10D 1/716 |
| | | | | 257/E21.018 |
| 8,860,114 | B2 * | 10/2014 | Yen ..................... | H01L 23/5223 |
| | | | | 257/306 |
| 9,224,685 | B1 * | 12/2015 | Ding ................... | H01L 23/5226 |
| 10,475,878 | B2 * | 11/2019 | Bergendahl ........... | H10D 1/043 |

(Continued)

FOREIGN PATENT DOCUMENTS

| | | | | |
|---|---|---|---|---|
| KR | 20070088167 A * | 8/2007 | ............. | H10D 84/00 |

OTHER PUBLICATIONS

Brunet et al., "High-Density 3-D Capacitors for Power Systems On-Chip: Evaluation of a Technology Based on Silicon Submicrometer Pore Arrays Formed by Electrochemical Etching", in IEEE transactions on power electronics. Dec. 10, 2012;28(9), pp. 1-9.

*Primary Examiner* — Dion R. Ferguson
(74) *Attorney, Agent, or Firm* — Harrity & Harrity, LLP

(57) ABSTRACT

A metal-insulator-metal (MIM) capacitor includes a dielectric layer forming a plane and a capacitor dielectric formed in a pattern having a width parallel to the plane and a height transverse to the plane. Electrodes are formed as sidewall spacers on opposite sides of the width of the capacitor dielectric. Each of the electrodes has a contact to make an electrical connection to the electrode, the contact being disposed within the height.

20 Claims, 8 Drawing Sheets

<u>204</u>

(56)                References Cited

U.S. PATENT DOCUMENTS

| | | | |
|---|---|---|---|
| 10,497,582 B2 | 12/2019 | Voiron et al. | |
| 10,643,985 B2 * | 5/2020 | Cheng | H10D 1/20 |
| 10,692,967 B1 * | 6/2020 | Chen | H10D 1/714 |
| 11,545,544 B2 | 1/2023 | Leng et al. | |
| 11,984,353 B2 * | 5/2024 | Tseng | H01L 23/5223 |
| 2005/0133848 A1 * | 6/2005 | Rotella | H10D 84/212 |
| | | | 257/532 |
| 2006/0024899 A1 * | 2/2006 | Crenshaw | H10D 1/688 |
| | | | 257/E21.019 |
| 2006/0024902 A1 * | 2/2006 | Ajmera | H10D 1/696 |
| | | | 438/387 |
| 2007/0096252 A1 * | 5/2007 | Hudson | H01G 4/33 |
| | | | 257/532 |
| 2007/0278551 A1 * | 12/2007 | Anthony | H01L 23/5225 |
| | | | 257/307 |
| 2008/0158771 A1 * | 7/2008 | Chinthakindi | H01G 4/005 |
| | | | 29/25.03 |
| 2010/0032801 A1 * | 2/2010 | Jacobs | H01L 23/5223 |
| | | | 257/532 |
| 2012/0153434 A1 * | 6/2012 | Abou-Khalil | H10D 1/711 |
| | | | 257/532 |
| 2013/0221482 A1 * | 8/2013 | Cheng | H10D 1/68 |
| | | | 257/532 |
| 2017/0352719 A1 * | 12/2017 | Tsai | H01G 4/012 |
| 2018/0190761 A1 * | 7/2018 | Chiang | H10D 1/716 |
| 2018/0197946 A1 * | 7/2018 | Leobandung | H01L 23/5223 |
| 2019/0051596 A1 | 2/2019 | Suo et al. | |
| 2019/0189735 A1 * | 6/2019 | Li | H10D 1/714 |
| 2019/0378796 A1 | 12/2019 | Cheng et al. | |
| 2020/0393503 A1 * | 12/2020 | Cliquennois | H10D 1/68 |
| 2021/0028165 A1 | 1/2021 | Yu et al. | |
| 2022/0367609 A1 * | 11/2022 | Chen | G01R 27/2605 |
| 2024/0395458 A1 * | 11/2024 | Obata | H01G 4/385 |
| 2024/0404943 A1 * | 12/2024 | Frost | H10D 1/692 |
| 2025/0113498 A1 * | 4/2025 | Katakam | H10D 1/042 |
| 2025/0218928 A1 * | 7/2025 | Frost | H10D 1/716 |
| 2025/0248056 A1 * | 7/2025 | Hung | H01L 23/5223 |

* cited by examiner

A-A

A-A

204

METAL SPACER 3D-MIM CAPACITOR

BACKGROUND

The present invention generally relates to semiconductor devices and processing methods, and more particularly to three-dimensional metal-insulator-metal (MIM) capacitor structures with metal spacer electrodes.

Metal-insulator-metal (MIM) capacitors are parallel plate capacitors formed by two metal films separated by an insulator material. MIM capacitors have been widely used. A typical MIM capacitor includes a top metal electrode, a dielectric/insulator layer and a bottom metal electrode. Voltage is applied across the metal electrodes which results in charge storage within the formed capacitor configuration.

MIM capacitors can suffer from a low Q factor. Premium areal space on a semiconductor chip is often an issue with MIM capacitors since MIM capacitors consume chip real estate due to their size. As node sizes shrink on semiconductor devices, scaling of MIM capacitors is increasingly more difficult.

SUMMARY

In accordance with an embodiment of the present invention, a metal-insulator-metal (MIM) capacitor includes a dielectric layer forming a plane and a capacitor dielectric formed in a pattern having a width parallel to the plane and a height transverse to the plane. Electrodes disposed on opposite sides of the width of the capacitor dielectric, as sidewall spacers. Each of the electrodes has a contact to make an electrical connection to a respective electrode, the contact being disposed within the height.

In accordance with another embodiment of the present invention, a MIM capacitor includes a dielectric layer forming a plane and a capacitor dielectric formed in a pattern having a width parallel to the plane and a height transverse to the plane. Electrodes are formed as sidewall spacers on opposite sides of the width of the capacitor dielectric. The electrodes define a footprint area of the MIM capacitor based on outer dimensions of the pattern wherein a ratio of electrode area to total footprint area is less than 20%.

In accordance with another embodiment of the present invention, a method for forming a MIM capacitor includes patterning a capacitor dielectric on a plane of dielectric layer in a pattern having a width parallel to the plane and a height transverse to the plane; conformally depositing electrode material over the width and height of the pattern; etching the electrode material to remove the electrode material from horizontal surfaces including the width to form as sidewall spacers on opposite sides of the width of the capacitor dielectric; and forming contacts to each of the electrodes to make an electrical connection to a respective electrode, the contact being disposed within the height.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
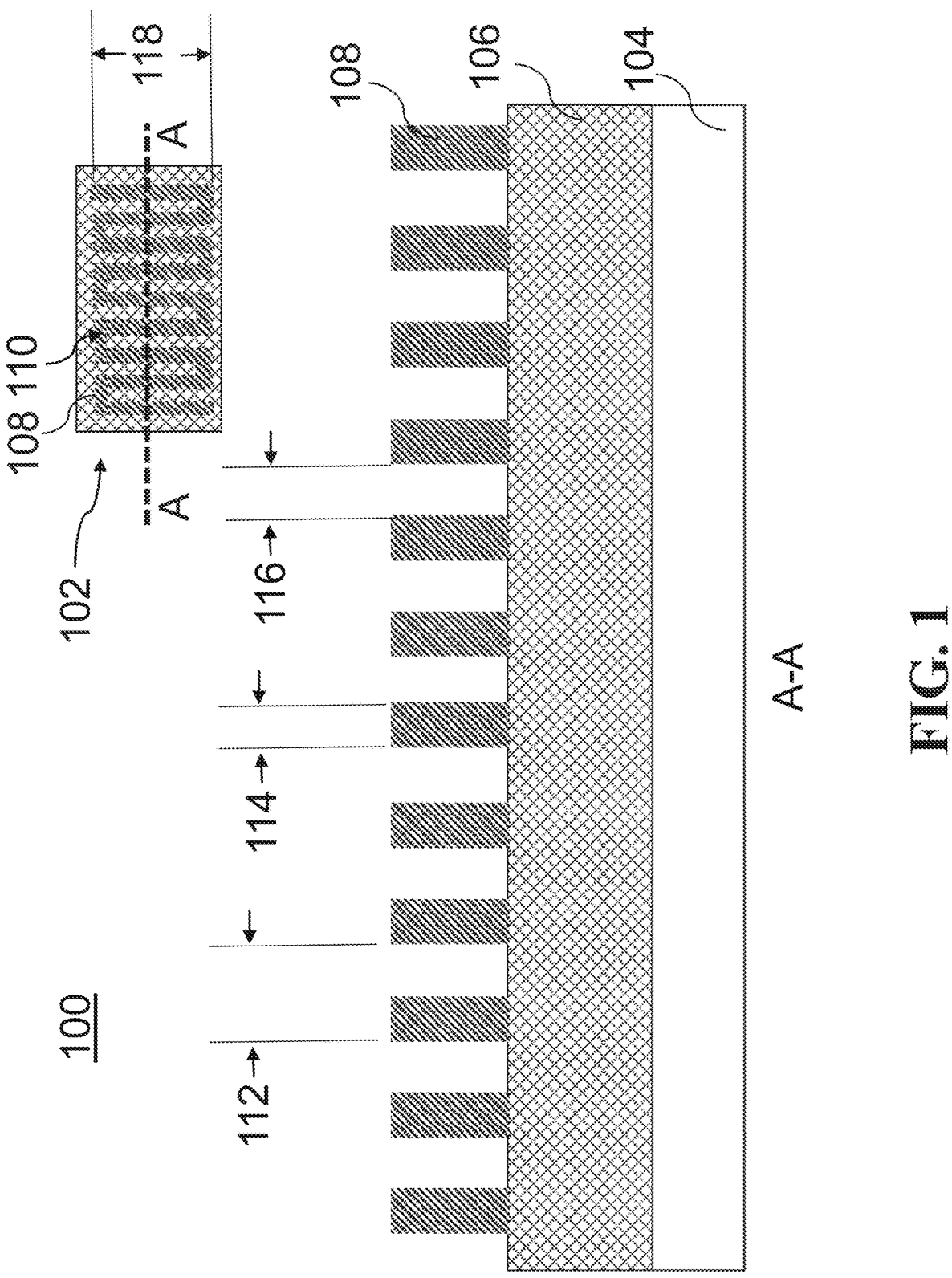
FIG. 1 shows a layout view and a cross-sectional view, taken at section line A-A of the layout view, of a semiconductor device having a dielectric layer on which a capacitor dielectric is formed and patterned, in accordance with an embodiment of the present invention.

In accordance with embodiments of the present invention, devices and methods are described which include metal-insulator-metal (MIM) capacitors and semiconductor devices with MIM capacitors and methods for making the same. In accordance with embodiments of the present invention, a high density capacitor structure and method for making the high density capacitor structure are provided. Embodiments of the present invention include MIM capacitors with a high Q factor and high density scaling possible for advanced nodes. MIM capacitors in accordance with the present embodiments reduce on-chip real estate issues by including high surface area features for capacitor plates.

In one method, electrode material for forming plates for the MIM capacitor includes a metal that can be subtractively etched, e.g., W, Ru, etc. A high dielectric constant (high-k dielectric) material can be employed for an insulator that has good adhesion with the electrode material, e.g., HfOx. The high-k dielectric can be fully surrounded by a metal liner. In one embodiment, a same metal is present on both sides of the high-k dielectric. The MIM capacitor structures in accordance with the present invention provide a percentage of metal conductor to other materials (e.g., dielectric) in the capacitor device that is less than 20% with a same or better capacitance. This is computed by taking the chip area occupied by the capacitor and taking a ratio of the area of the conductor to the total. Many conventional MIM capacitors provide a percentage of metal conductor to other materials (e.g., dielectric) in the capacitor device of about 80%.

MIM capacitors in accordance with embodiments of the present invention include a shaped high-k dielectric having a conductive spacer formed on opposing sides of the high-k dielectric. The high-k dielectric can be shaped in a serpentine pattern, in a comb pattern, an E-shaped pattern, or other patterns. The MIM capacitors can be formed on a dielectric layer, e.g., an interlevel dielectric layer (ILD). The high-k dielectric is deposited on the dielectric layer followed by a patterning of trenches in the high-k dielectric layer. A conductive material is conformally deposited over the pattern followed by an etch back to leave the conductive material on sidewalls or the trenches. The conductive material can be deposited by a metal spacer deposition process followed by a spacer etch-back process to remove conductive material from horizontal surfaces. The conductive material can be removed by a subtractive etch. Electrodes formed on opposite sides of a capacitor dielectric are formed simultaneously from a same material and same processing steps.

The MIM capacitor enables extremely dense structures which improves the real estate for advanced nodes. The dense pattern is achievable by employing optical/extreme ultraviolet (EUV) masks through either single patterning or a pitch doubling process, e.g., Self-Aligned Double Pattern that include a high device density to obtain the dense structure. Dense device structures are particularly useful for, e.g., high-end artificial intelligence (AI) and cloud technology development applications, among other applications.

In one embodiment, a high-k dielectric trench is patterned using optical/EUV lithography in a serpentine structure. A conductive metal spacer is conformally deposited on the high-k trenches. A spacer etch back process is performed to retain metal spacers on the side walls. The remaining space is filled by a dielectric material, e.g., a high-k dielectric or other dielectric material followed by planarization (e.g., by chemical mechanical polishing (CMP)). Contacts can be patterned to connect to side wall spacers forming a first electrode and a second electrode of the MIM capacitor.

Embodiments of the present invention can be employed in any type of semiconductor device or chip. For example, the present embodiments can include functional circuits such as, e.g., mixed signal circuits, analog circuits, radio frequency (RF) circuits, memory devices, such as, e.g. dynamic random access memory (DRAM), embedded DRAM, logic operation circuits, input/output (IO) circuits, high performance computing (HPC) circuits, clock buffers, processors, or any other integrated circuit chip or combinations thereof.

Referring now to the drawings in which like-numerals represent the same or similar elements and initially to FIG. 1, a cross-sectional view of a semiconductor device 100 taken at section line A-A of inset 102 is shown in accordance with an embodiment of the present invention. Inset 102 shows a top layout view of the semiconductor device 100. The semiconductor device 100 includes a dielectric layer 106 that can be formed at any stage of the fabrication process. In one embodiment, the dielectric layer 106 includes an interlevel dielectric layer (ILD).

In one embodiment, the semiconductor device 100 includes underlying layers 104, which can include a semiconductor substrate, active area components, metallization layers with dielectric material and any other structures needed for the operation of the semiconductor device 100.

The semiconductor substrate can include any suitable substrate structure, e.g., a bulk semiconductor, a semiconductor-on-insulator (SOI) substrate, etc., and preferably includes a monocrystalline semiconductor. In one example, the substrate can include a silicon-containing material. Illustrative examples of Si-containing materials suitable for the substrate can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc. The active area components can include, e.g., active regions, such as source/drain regions (S/D regions), gate structures, memory elements, diodes and any other electrical or electronic components. The active area components are electrically connected using vias/contacts and metal lines. The vias/contacts and metal lines are buried in dielectric material, which can include dielectric layers, such as, interlevel dielectric (ILD) layers.

In one embodiment, a capacitor dielectric 108 is deposited as a layer on the dielectric layer 106. The capacitor dielectric 108 can be deposited using a deposition method, such as, e.g., chemical vapor deposition (CVD), plasma enhanced CVD (PECVD), atomic layer deposition (ALD) or any other suitable deposition method.

The capacitor dielectric 108 can include any dielectric material, but preferably includes a high-k dielectric material, such as, e.g., hafnium silicate, zirconium silicate, hafnium oxide (e.g., hafnium dioxide) and zirconium oxide. Hafnium oxide also provides good adhesion for electrode materials as will be described.

The capacitor dielectric 108 is patterned using a lithographic process, e.g., using EUV. In one embodiment, a hard mask (not shown) may be formed by blanket depositing a layer of hard mask material, providing a patterned photoresist on top of the layer of hard mask material, and then etching the layer of hard mask material to provide the hard mask pattern for etching the capacitor dielectric 108. The patterned photoresist can be produced by applying a blanket photoresist layer to the surface of the hard mask material and exposing the photoresist layer to a pattern of radiation, and then developing the pattern into the photoresist layer utilizing resist developer. The pattern in the photoresist layer is transferred to the hard mask by an etch process.

The pattern of radiation can include a serpentine pattern 110 shown in the inset 102 or other patterns, such as a comb pattern or either of these or other patterns with different pitches amplitudes or phases, as needed, can be provided.

Since the capacitor dielectric 108 is etched down to the dielectric layer 106, the capacitor dielectric 108 needs to be etched selective to the dielectric layer 106. In one embodiment, an anisotropic etch process, such as reactive ion etching (RIE) or ion beam etching (IBE) can be employed. The dielectric layer 106 can include a silicon oxide, a silicon nitride, silicon oxynitride or ant other suitable dielectric material where the capacitor dielectric 108 can be selectively etched relative thereto.

The capacitor dielectric 108 includes a pitch or phase 112, thickness 114 and spacing 116 that are substantially uniform in cross-section. An amplitude 118 is also uniform for the serpentine pattern 110 shown. It should be understood that, in other embodiments, the phase 112, thickness 114, spacing 116 and amplitude 118 can be varied over the serpentine pattern 110.

Figure 2:
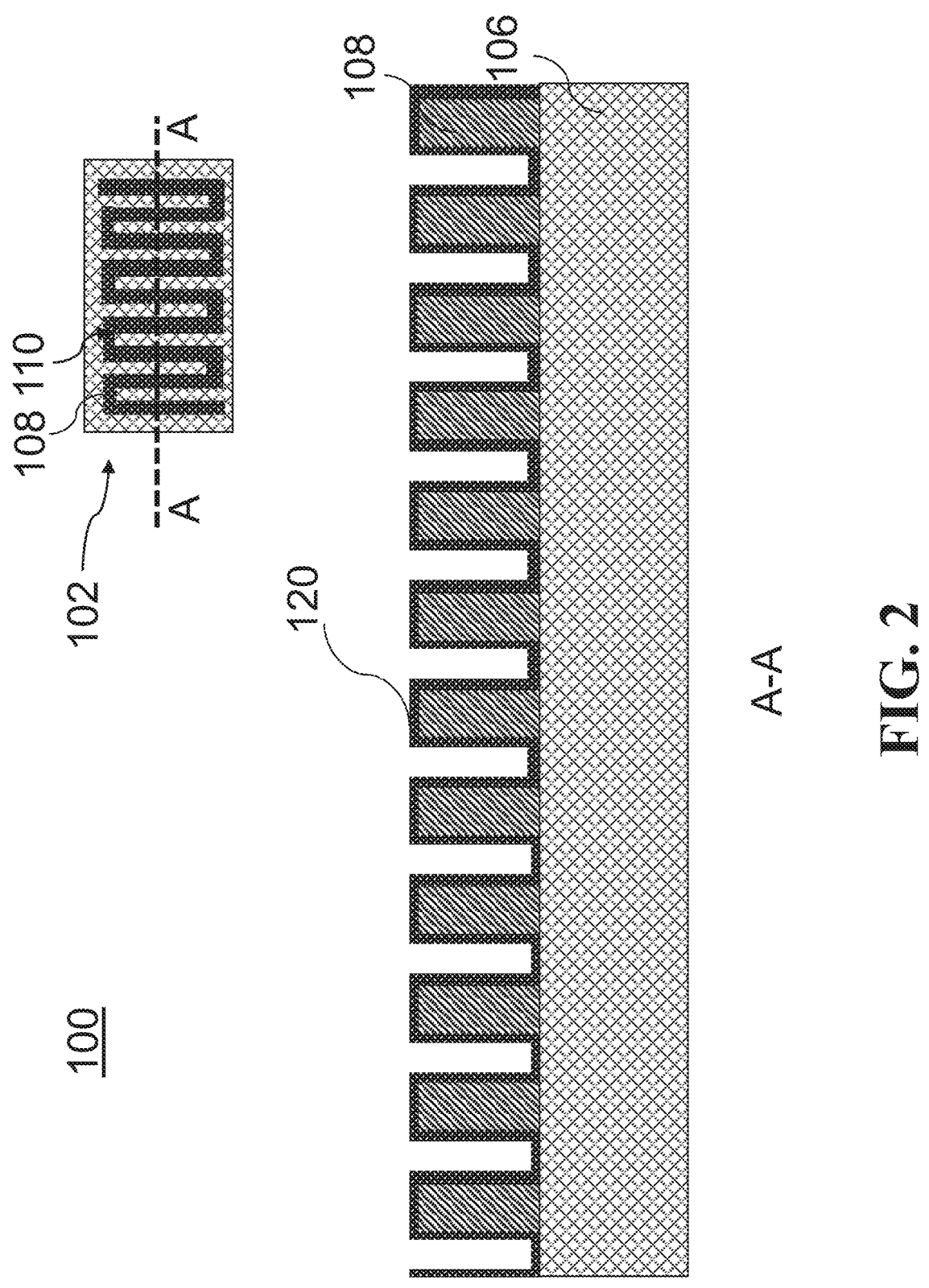
FIG. 2 shows a cross-sectional view of the semiconductor device of FIG. 1 having an electrode material conformally deposited over the patterned capacitor dielectric, in accordance with an embodiment of the present invention.

Referring to FIG. 2, a cross-sectional view of the semiconductor device 100 is shown after an electrode material 120 is deposited in accordance with an embodiment of the present invention. The electrode material 120 includes a metal or metallic compound that strongly adheres to the capacitor dielectric 108. In one embodiment, the electrode material 120 can include W, Ru, TiN, TaN or combination of these and/or other materials. The electrode material 120 can be conformally deposited using a deposition method, such as, e.g., CVD, PECVD, ALD, physical vapor deposition (PVD) or any other suitable deposition method. The electrode material 120 lines tops, sides and spaces between the capacitor dielectric 108, which is formed in a pattern.

Figure 3:
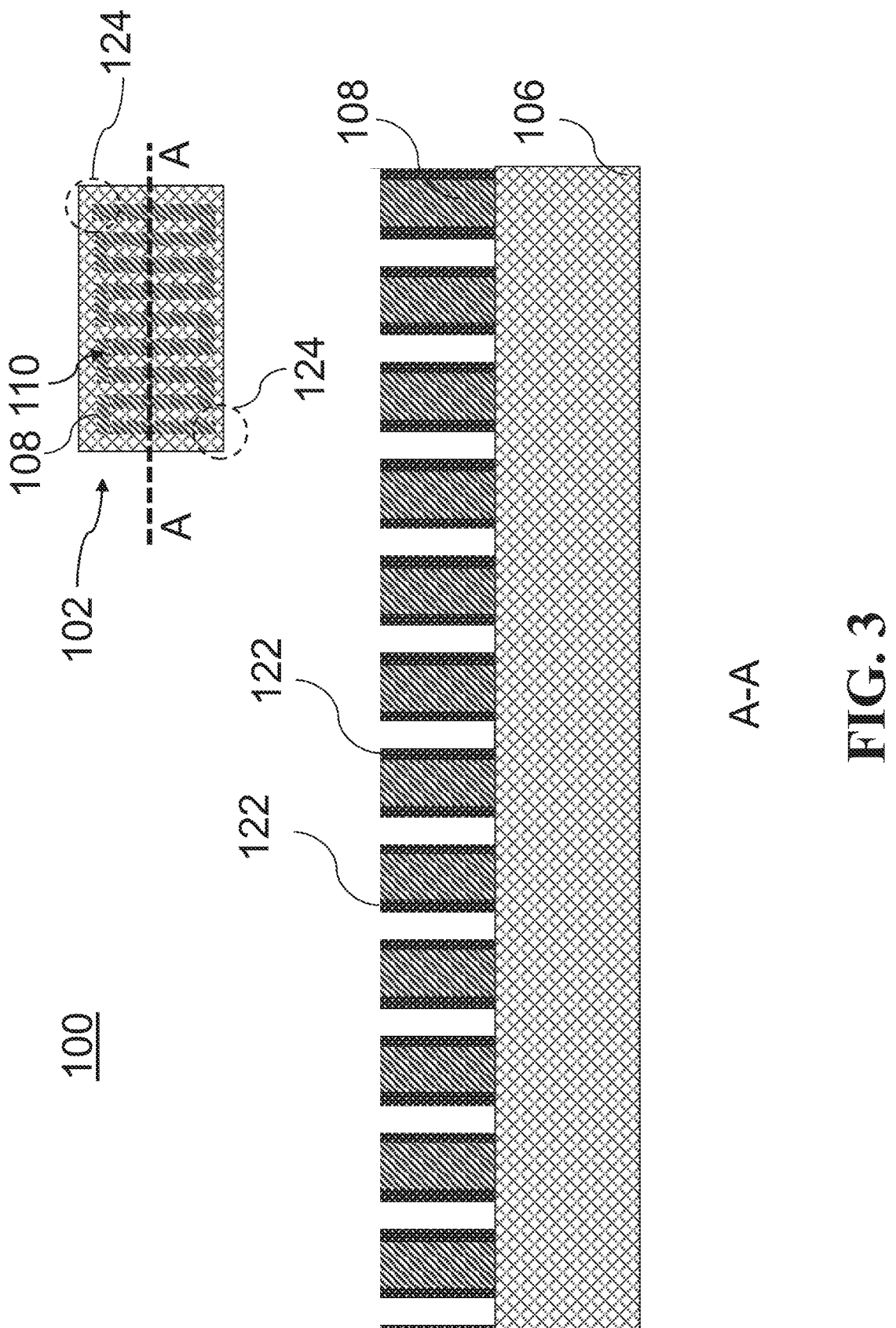
FIG. 3 shows a cross-sectional view of the semiconductor device of FIG. 2 having the electrode material etched to remove the electrode material from horizontal surfaces to simultaneously form electrodes as sidewall spacers on opposing surfaces of a height of the patterned capacitor dielectric, in accordance with an embodiment of the present invention.

Referring to FIG. 3, a cross-sectional view of the semiconductor device 100 is shown after the electrode material 120 has been etched to form spacers in an etch-back process in accordance with an embodiment of the present invention. The electrode material 120 is etched in a subtractive etching process which forms spacers 122 on sidewalls of the capacitor dielectric 108. The subtractive etching process removes material from horizontal surfaces by, e.g., RIE. The capacitor dielectric 108 acts as a mandrel for the formation of spacers 122. The spacers 122, and therefore electrodes of the MIM capacitor, are formed simultaneously. As a result, the electrodes are substantially uniform in size and material composition.

In some embodiments, end portions 124 can have the electrode material 120 removed therefrom to form two separate plates of spacers 122, one spacer on each side of the serpentine pattern 110. The spacers 122 in the serpentine pattern 110 form three-dimensional electrode plates for a three-dimensional MIM capacitor.

Figure 4:
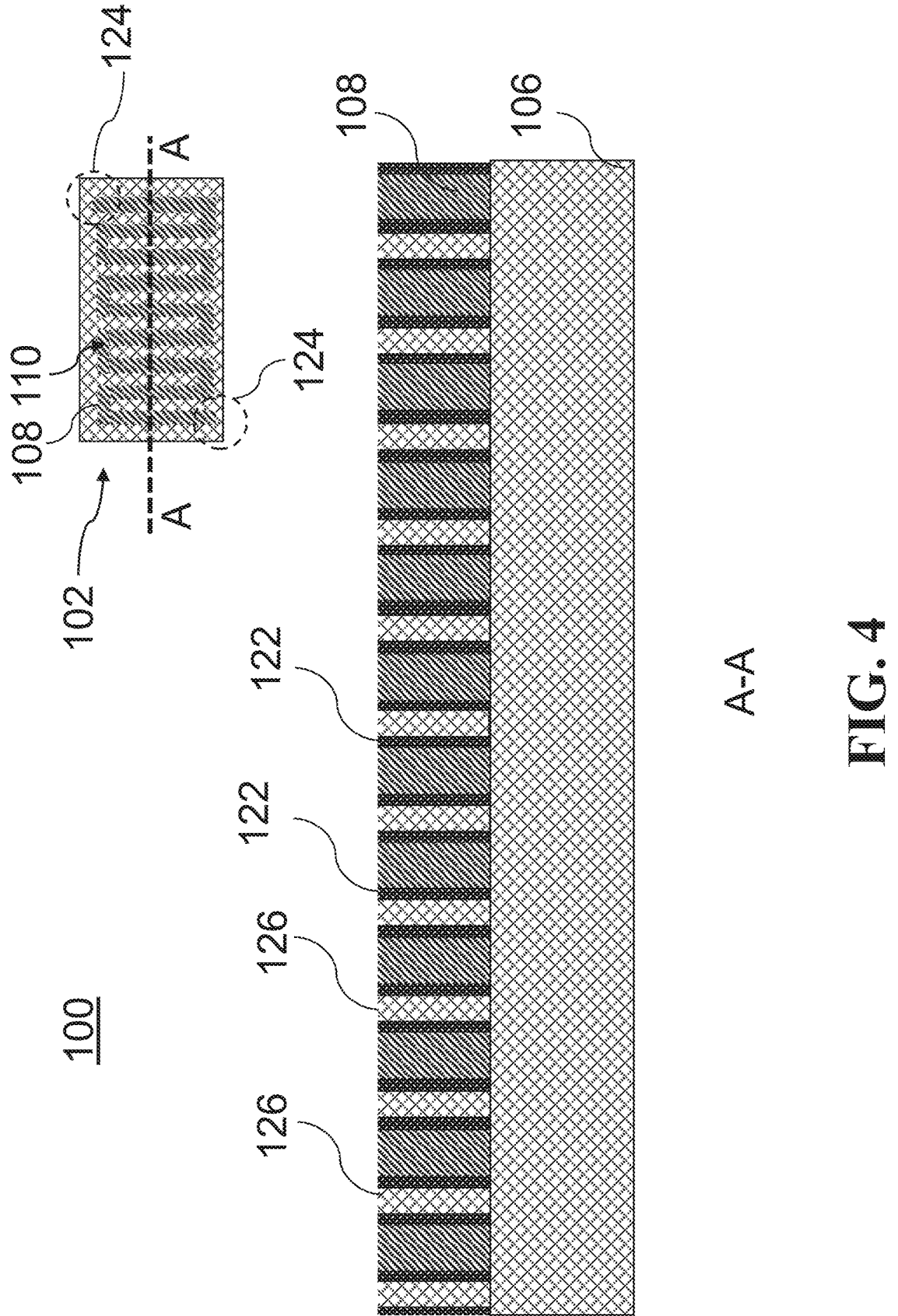
FIG. 4 shows a cross-sectional view of the semiconductor device of FIG. 3 having gaps between spacers filled with dielectric material and a planarization process performed to level off a top surface and to optionally remove damage from top portions of the electrodes and the capacitor dielectric, in accordance with an embodiment of the present invention.

Referring to FIG. 4, a cross-sectional view of the semiconductor device 100 is shown after a dielectric fill and planarization process has been performed in accordance with an embodiment of the present invention. A dielectric fill is performed by depositing a dielectric material 126 over the serpentine pattern 110 to fill in gaps formed between spacers 122. The dielectric material 126 can include any suitable material, but preferably includes a same material as dielectric layer 106. In useful embodiments, the dielectric material 126 can include, e.g., a silicon oxide, a silicon nitride, silicon oxynitride or any other suitable dielectric material. The dielectric material 126 can be deposited using a deposition method, such as, e.g., CVD, PECVD or any other suitable deposition method.

A planarization process is performed to planarize a top surface 128 to level off the dielectric material 126 down to the spacers 122. The planarization process can include, e.g., a chemical mechanical polish (CMP). The planarization process can also be employed to further reduce a top portion of the spacers 122 and the capacitor dielectric 108 to ensure a uniform thickness of the spacers 122 by ensuring that any rounding off caused by earlier etching (e.g., RIE in the etch back process) of the top of the spacers 122 is reduced or eliminated. In this way, the spacers 122, which form electrodes, have a more uniform thickness from top to bottom.

Figure 5:
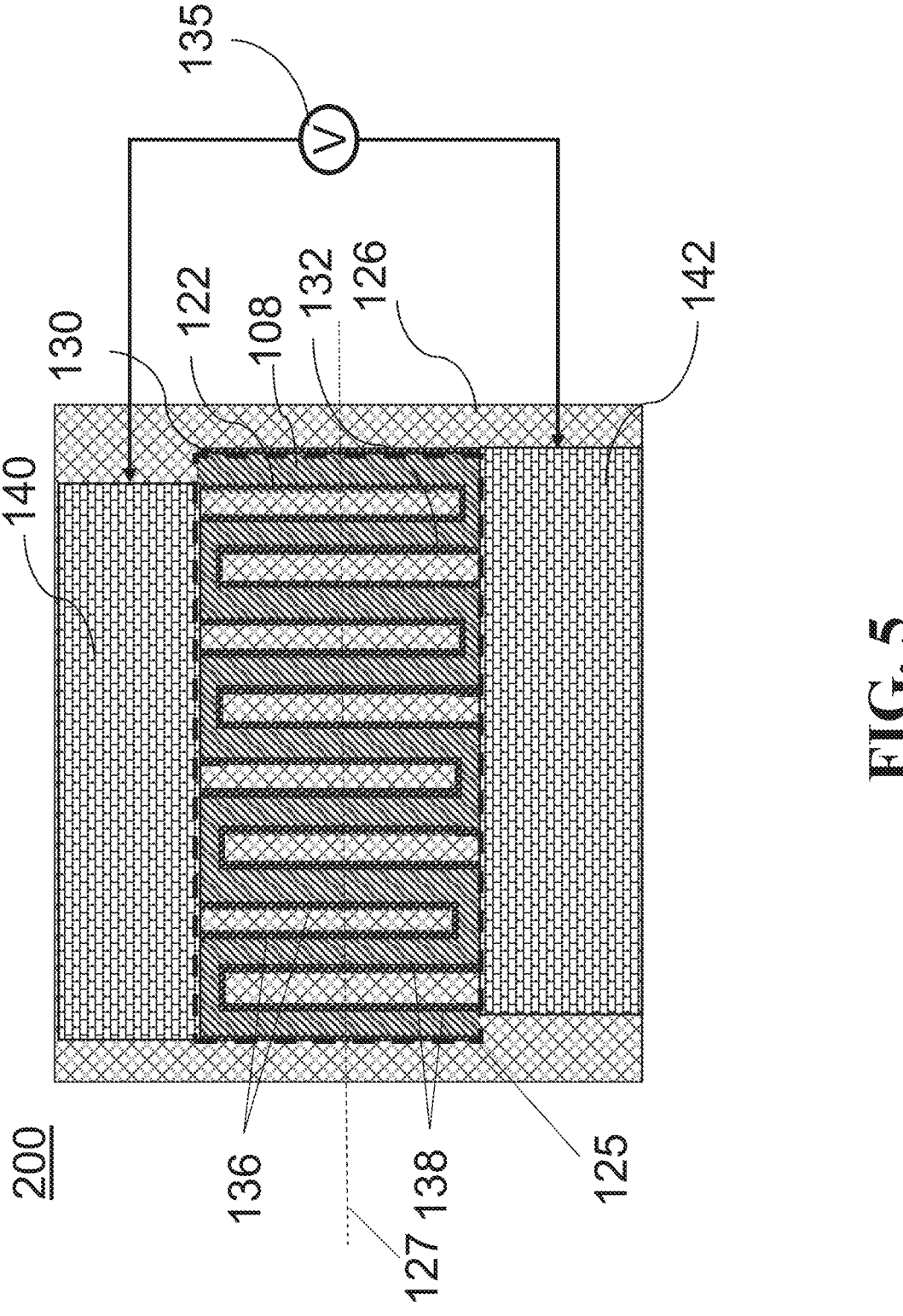
FIG. 5 shows a layout view of a semiconductor device having contacts extending parallel with a longitudinal axis of a metal-insulator-metal (MIM) capacitor where electrodes are separated into portions forming peninsulas, in accordance with an embodiment of the present invention.

Referring to FIG. 5, a top down view of the semiconductor device 100 is shown after formation of contacts that run parallel to a longitudinal axis of a MIM capacitor 200 in accordance with an embodiment of the present invention. Contacts 140 and 142 are fabricated to make electrical contact to respective capacitor electrodes 130 and 132. In one embodiment, the contacts 140 and 142 make direct contact with a sidewall of the electrodes 130 and 132 in the same plane to form the MIM capacitor 200. In FIG. 5, the contacts 140 and 142 extend parallel to a longitudinal axis 127 of the MIM capacitor 200. This can be compared to FIG. 7 where contacts 150 and 152 extend perpendicular to the longitudinal axis 127 of the MIM capacitor 204.

MIM capacitor 200 includes electrodes 130 and 132 separated by a capacitor dielectric 108 to permit a voltage potential 135 to be held across the electrodes 130, 132 during operation.

Contacts 140, 142 can be formed in a same plane and within a same height as the electrodes 130, 132 and capacitor dielectric 108. Contact 140 is formed to make electrical contact with electrodes 130. In one embodiment, the electrode 130 includes separate portions 136, which form peninsulas with electrode 130 in contact with contact 140. Contact 142 is formed to make electrical contact with electrodes 132. In one embodiment, the electrode 132 includes separate portions 138, which form peninsulas with electrode 132 in contact with contact 142.

The MIM capacitor 200 occupies a footprint 125 that includes the extent of the electrodes 130, 132. Here, the footprint 125 is rectangular and encompasses the extent and area occupied by the electrodes 130, 132. It should by understood that the footprint 125 can include other shapes, e.g., round, oval, square, etc. for different capacitor patterns.

The MIM capacitor 200 in accordance with the present embodiments includes a metal (e.g., electrode area) to total footprint area ratio of less than 20%. This is a significant improvement over solid plate capacitors. The low metal to total footprint area ratio permits reduced capacitor size while maintaining or improving a capacitance magnitude.

Figure 6:
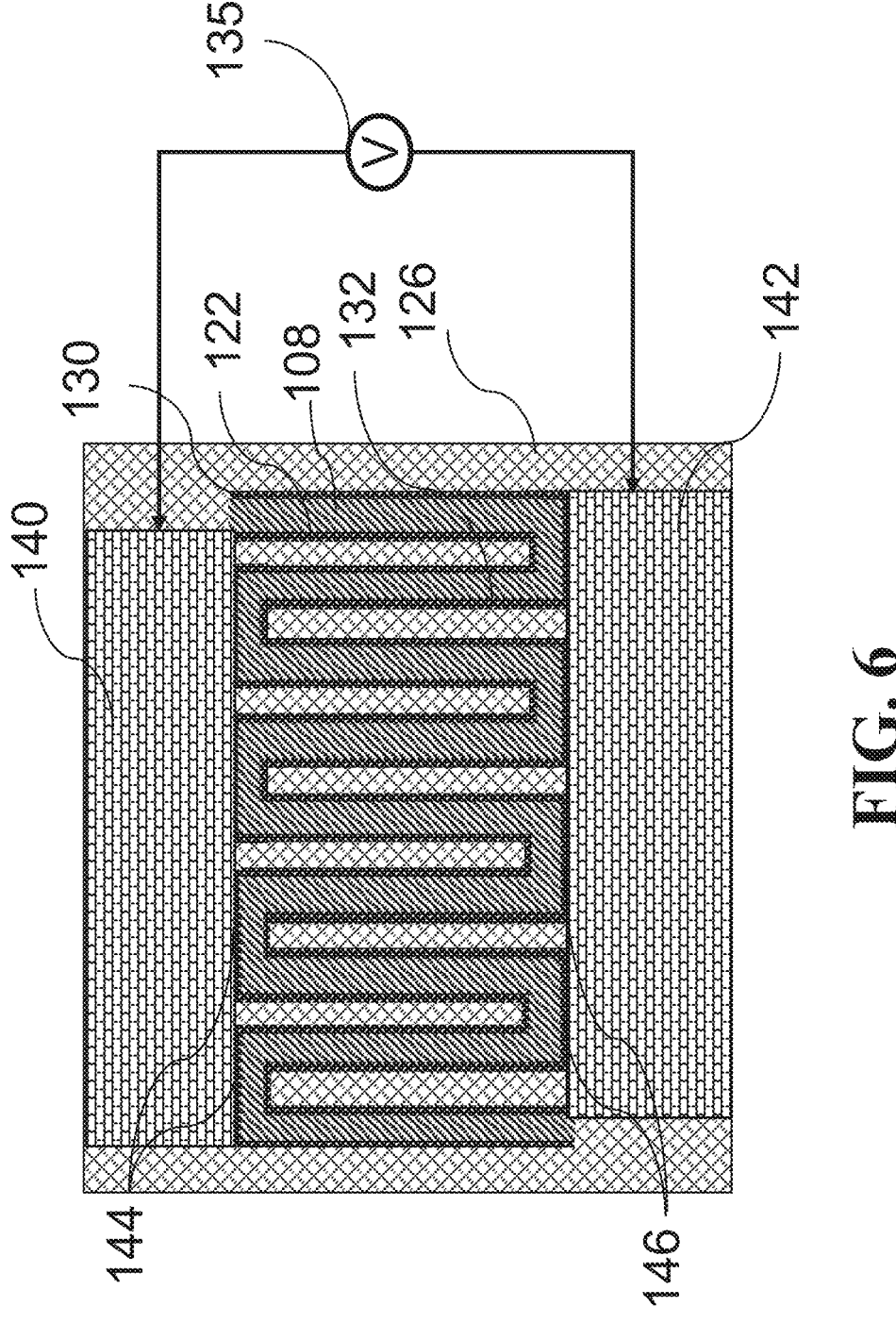
FIG. 6 shows a layout view of a semiconductor device having contacts extending parallel to a longitudinal axis of a MIM capacitor with two electrodes separated by capacitor dielectric forming a serpentine pattern, in accordance with an embodiment of the present invention.

Referring to FIG. 6, a top down view of the semiconductor device 100 is shown after formation of contacts that run parallel to a longitudinal axis of a MIM capacitor 202 in accordance with an embodiment of the present invention. Contacts 140 and 142 are fabricated to make electrical contact to respective capacitor electrodes 130 and 132. In one embodiment, the contacts 140 and 142 make direct contact with a sidewall of the electrodes 130 and 132 in the same plane to form the MIM capacitor 202. MIM capacitor 202 includes electrodes 130 and 132 separated by a capacitor dielectric 108 to permit a voltage potential 135 to be held across the electrodes 130, 132 during operation.

Contacts 140, 142 can be formed in a same plane and within a same height as the electrodes 130, 132 and capacitor dielectric 108. Contact 140 is formed to make electrical contact with electrode 130. In one embodiment, electrode portions 144 electrically connect with contact 140 providing a single electrode 130. Contact 142 is formed to make electrical contact with electrode 132. Electrode portions 146 electrically connect with contact 142 providing a single electrode 132.

Figure 7:
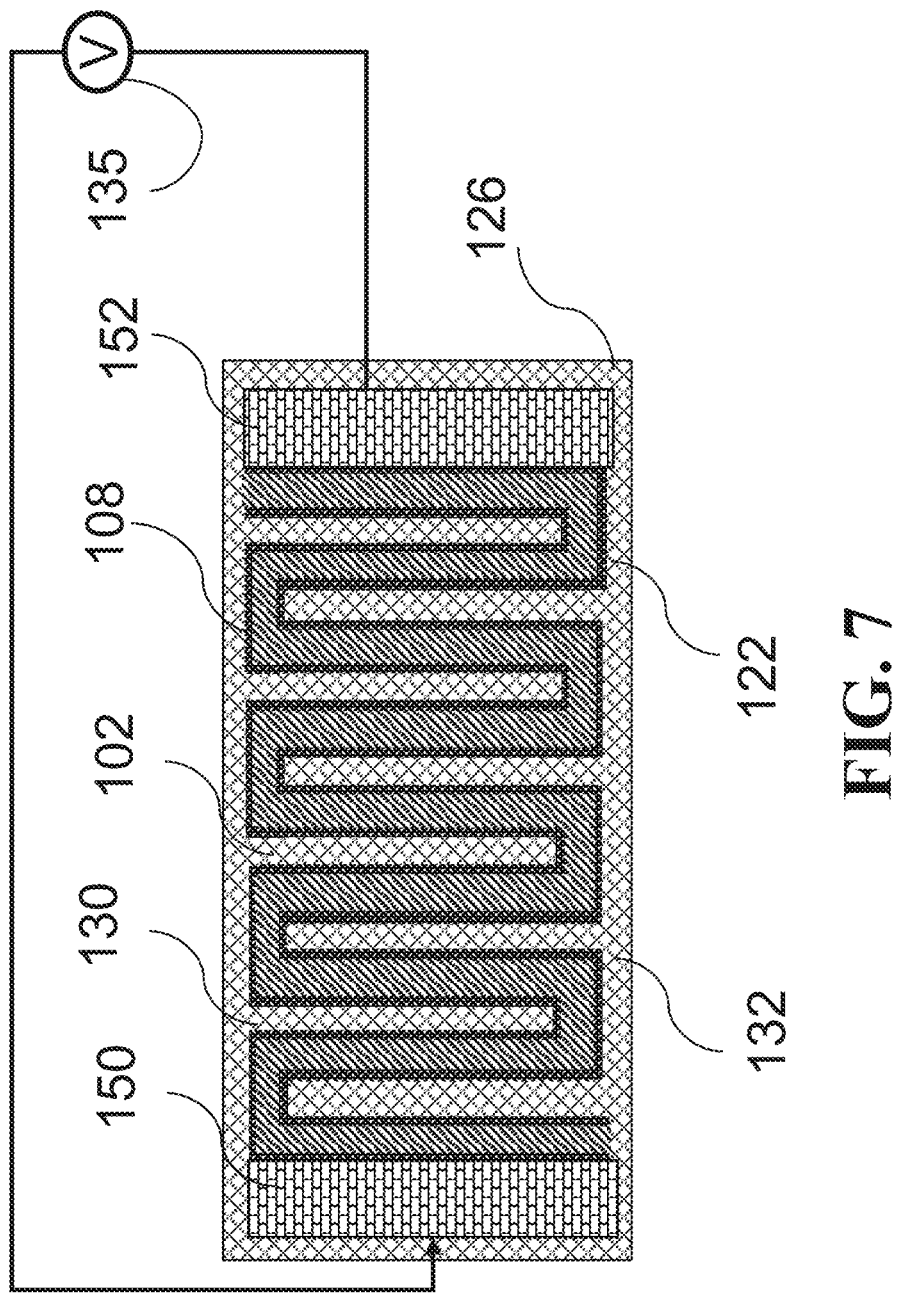
FIG. 7 shows a layout view of a semiconductor device having contacts extending perpendicular to a longitudinal axis of a MIM capacitor with two electrodes separated by capacitor dielectric forming a serpentine pattern, in accordance with an embodiment of the present invention.

Referring to FIG. 7, a top down view of the semiconductor device 100 is shown after formation of contacts that run transversely to a longitudinal axis of a MIM capacitor 204 in accordance with an embodiment of the present invention. Contacts 150 and 152 are fabricated to make electrical contact to respective capacitor electrodes 130 and 132. In one embodiment, the contacts 150 and 152 make direct contact with a sidewall of the electrodes 130 and 132 in the same plane to form the MIM capacitor 204.

MIM capacitor 204 includes electrodes 130 and 132 separated by a capacitor dielectric 108 to permit a voltage potential 135 to be held across the electrodes 130, 132 during operation.

Contacts 150, 152 can be formed in a same plane and within a same height as the electrodes 130, 132 and capacitor dielectric 108. Contact 150 is formed to make electrical contact with electrode 130 (e.g., unseparated single electrode). Contact 152 is formed to make electrical contact with electrode 132 (e.g., unseparated single electrode).

Figure 8:
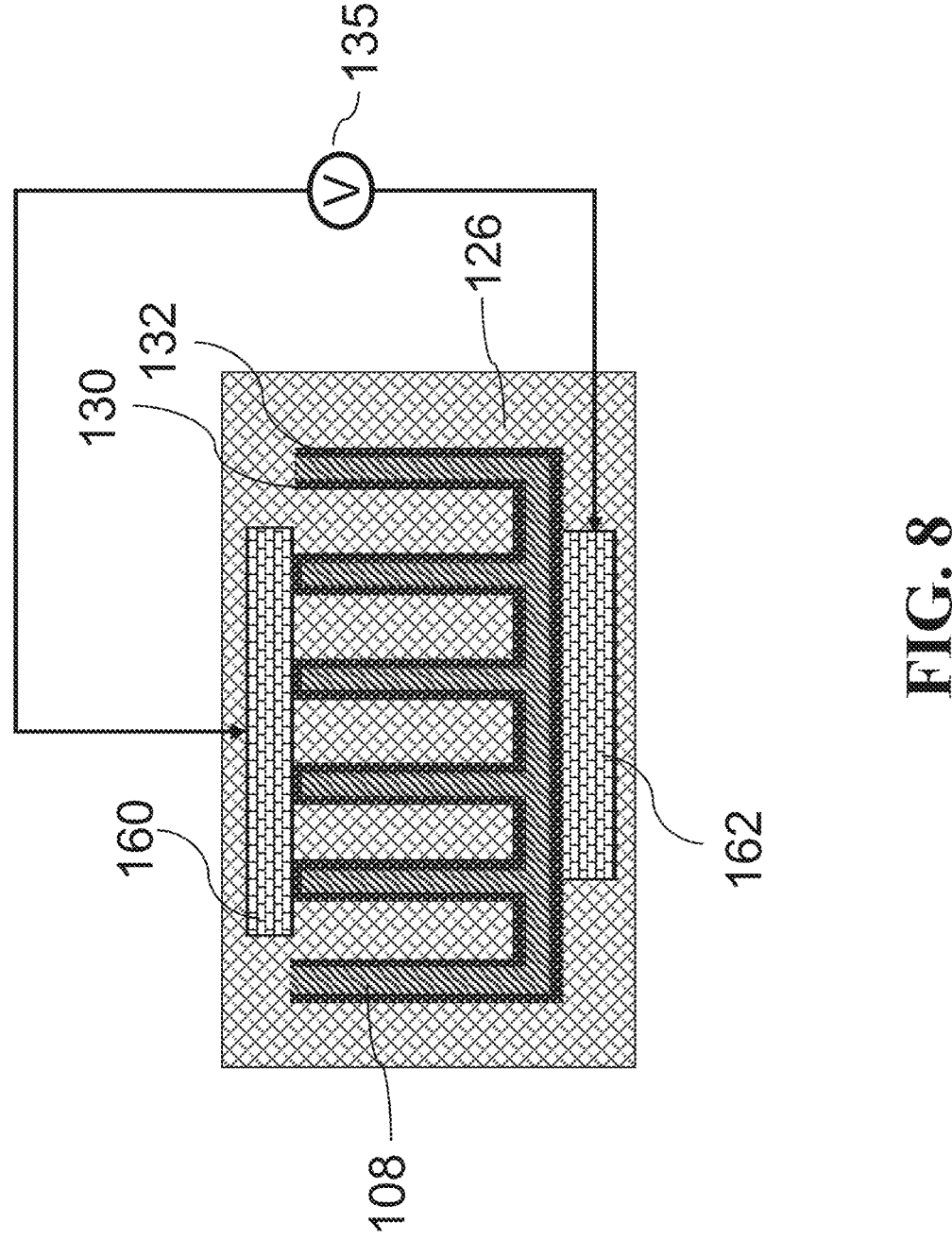
FIG. 8 shows a layout view of a semiconductor device having contacts extending parallel with to a longitudinal axis of a MIM capacitor with two electrodes separated by capacitor dielectric forming a comb pattern, in accordance with an embodiment of the present invention.

Referring to FIG. 8, a top down view of the semiconductor device 100 is shown after formation of contacts that run transversely to a longitudinal axis of a MIM capacitor 206 with a comb pattern in accordance with an embodiment of the present invention. The MIM capacitor 206 includes electrodes 130 and 132 separated by a capacitor dielectric 108 to permit a voltage potential 135 to be held across the electrodes 130, 132 during operation. In one embodiment, contacts 160 and 162 make direct contact with a sidewall of the electrodes 130 and 132 in the same plane to form the MIM capacitor 206. In one embodiment, electrode 130 connects at points or teeth of the comb pattern, and electrode 132 connects to the spine of the comb pattern. It should be understood that the electrodes 130 and 132 can connect with contacts 160, 162 is a number of different configurations. For example, fewer than all teeth of the comb pattern can connect to contact 160 and contact 162 can have its size adjusted accordingly.

Contacts 160 and 162 are fabricated to make electrical contact to respective capacitor electrodes 130 and 132. Contacts 160, 162 can be formed in a same plane and within a same height as the electrodes 130, 132 and capacitor dielectric 108. Contact 160 is formed to make electrical contact with electrode 130 (e.g., unseparated single electrode). Contact 162 is formed to make electrical contact with electrode 132 (e.g., unseparated single electrode).

The contacts 140, 142, 150, 152, 160 and 162 in FIGS. 5-8 can be formed using a similar fabrication process, for example, the structure of FIG. 4 can be employed. A hard mask can be patterned using lithography, and contact holes or trenches can be formed by etching into the dielectric material 126. A metal fill is performed to fill holes or trenches. The metal fill can include a deposition process, such as CVD, PECVD, sputtering or other suitable deposition process. The metal fill can include a metal, such as, e.g., Cu, Co, Ru, W, etc. a metal compound, e.g., TaN, TiN, etc., or combinations of these or other conductive materials. The metal fill is than planarized (e.g., by CMP). Processing continues with the formation of additional metal structures that permit electrical access to the MIM capacitors through the contacts 140, 142, 150, 152, 160 and 162.

It should be understood that the contacts 140, 142, 150, 152, 160 and 162 in FIGS. 5-8 are illustratively depicted in contact with one side of the serpentine or comb-shaped electrodes. However, contacts can be dropped down to land on any part of the electrodes, or contact electrodes on more than one side. For example, one contact can connect to an electrode on a left side and top portion while a second contact can connect to the other electrode on a right side and bottom portion. Further, while the contacts 140, 142, 150, 152, 160 and 162 in FIGS. 5-8 are depicted as rectangular in shape in the top view, the contacts 140, 142, 150, 152, 160 and 162 can be formed as any other suitable shape in the top view, e.g., round, square, L-shaped, etc.

MIM capacitors 200, 202, 204 and 206 include a three-dimensional high-density MIM (metal-insulator-metal) capacitor structure, wherein the three-dimensional high-density MIM capacitor comprises a first anode/cathode (metal), an insulating layer (insulator, e.g., high-k dielectric), a second anode/cathode (metal). A footprint of the MIM capacitors 200, 202, 204 and 206 includes a percentage of metal conductor (area of the electrodes 130, 132) in the capacitor device that is less than 20%. In this way, capacitor surface area is maximized while increasing capacitance capability. The electrodes 130 and 132 can include continuous structures having a comb or serpentine pattern and the insulating layer separates the metal of the electrodes

130 and 132. The electrodes 130 and 132 can include the same material. The electrodes 132, 132 and the capacitor dielectric 108 can have top and bottom surfaces substantially flush. In addition, contacts 140, 142, 150, 152, 160 and 162 can also be within a thickness of the electrodes 132, 132 and the capacitor dielectric 108.

The structures provided in accordance with embodiments of the present invention have distributed electrode patterns. The electrodes 132, 132 can follow serpentine or other meandering patterns which impact quality (Q) factor. Q-factor is a dimensionless number that is equal to a capacitor's reactance divided by the capacitor's parasitic resistance (ESR). The structures in accordance with embodiments of the present invention, increase reactance (e.g., greater surface area) and reduce ESR (e.g., less parasitic loss). The ESR varies with frequency for a given capacitor, and varies in accordance with the characteristics of the electrode structures and capacitor dielectric structure. Therefore, Q-factor would increase in accordance with embodiments of the present invention.

Exemplary applications/uses to which the present invention can be applied include, but are not limited to semiconductor devices. Semiconductor devices can include processors, memory devices, application specific integrated circuits (ASICs), logic circuits or devices, combinations of these and any other circuit device. In such devices, one or more semiconductor devices can be included in a central processing unit, a graphics processing unit, and/or a separate processor- or computing element-based controller (e.g., logic gates, etc.). The semiconductor devices can include one or more on-board memories (e.g., caches, dedicated memory arrays, read only memory, etc.). In some embodiments, the semiconductor devices can include one or more memories that can be on or off board or that can be dedicated for use by a hardware processor subsystem (e.g., ROM, RAM, basic input/output system (BIOS), etc.).

In some embodiments, the semiconductor devices can include and execute one or more software elements. The one or more software elements can include an operating system and/or one or more applications and/or specific code to achieve a specified result. In still other embodiments, the semiconductor devices can include dedicated, specialized circuitry that perform one or more electronic processing functions to achieve a specified result. Such circuitry can include one or more field programmable gate arrays (FPGAs), and/or programmable applications programmable logic arrays (PLAs).

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," "top," "bottom" and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of devices and methods (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A metal-insulator-metal (MIM) capacitor, comprising:
a dielectric layer forming a plane, the dielectric layer having capacitor electrodes;
a capacitor dielectric formed in a pattern having a width parallel to the plane and a height transverse to the plane;
dielectric electrodes disposed on opposite sides of the width of the capacitor dielectric as sidewall spacers; and
each of the dielectric electrodes having a separate contact to make an electrical connection thereto, the separate contact being disposed within the height.

2. The MIM capacitor as recited in claim 1, wherein the pattern includes a serpentine pattern on the dielectric layer.

3. The MIM capacitor as recited in claim 1, wherein the pattern includes a comb pattern on the dielectric layer.

4. The MIM capacitor as recited in claim 1, wherein electrode area to total footprint area of the MIM capacitor includes a ratio of less than 20%.

5. The MIM capacitor as recited in claim 1, wherein the contacts extend parallel to a longitudinal axis of the MIM capacitor.

6. The MIM capacitor as recited in claim 1, wherein the contacts extend perpendicular to a longitudinal axis of the MIM capacitor.

7. A metal-insulator-metal (MIM) capacitor, comprising:
a dielectric layer forming a plane;
a capacitor dielectric formed in a pattern having a width parallel to the plane and a height transverse to the plane; and
electrodes disposed on opposite sides of the width of the capacitor dielectric as sidewall spacers, the electrodes defining a footprint area of the MIM capacitor based on outer dimensions of the pattern wherein a ratio of electrode area to total footprint area is less than 20%.

8. The MIM capacitor as recited in claim 7, wherein the pattern includes a serpentine pattern on the dielectric layer.

9. The MIM capacitor as recited in claim 7, wherein the pattern includes a comb pattern on the dielectric layer.

10. The MIM capacitor as recited in claim 7, wherein each of the electrodes includes a contact to make an electrical connection to a respective electrode, the contact being disposed within the height.

11. The MIM capacitor as recited in claim 10, wherein the contacts extend parallel to a longitudinal axis of the MIM capacitor.

12. The MIM capacitor as recited in claim 10, wherein the contacts extend perpendicular to a longitudinal axis of the MIM capacitor.

13. A method for forming a metal-insulator-metal (MIM) capacitor, comprising:
patterning a capacitor dielectric on a plane of dielectric layer in a pattern having a width parallel to the plane and a height transverse to the plane;
conformally depositing electrode material over the width and height of the pattern;
etching the electrode material to remove the electrode material from horizontal surfaces, including the width, to form electrodes as sidewall spacers on opposite sides of the width of the capacitor dielectric; and
forming contacts to each of the electrodes to make an electrical connection to each electrode, the contact being disposed within the height.

14. The method as recited in claim 13, wherein the pattern includes a serpentine pattern on the dielectric layer.

15. The method as recited in claim 13, wherein the pattern includes a comb pattern on the dielectric layer.

16. The method as recited in claim 13, wherein electrode area to total footprint area of the MIM capacitor includes a ratio of less than 20%.

17. The method capacitor as recited in claim 13, wherein forming the contacts includes forming the contacts parallel to a longitudinal axis of the MIM capacitor.

18. The method as recited in claim 13, wherein forming the contacts includes forming the contacts perpendicular to a longitudinal axis of the MIM capacitor.

19. The method as recited in claim 13, wherein the electrodes of the MIM capacitor are formed simultaneously.

20. The method as recited in claim 13, further comprising planarizing a top portion of the electrodes and the capacitor dielectric.

* * * * *